United States Patent
Rao et al.

(10) Patent No.: US 10,797,824 B2
(45) Date of Patent: Oct. 6, 2020

(54) FAST RESTORATION USING SDFEC DEFECTS IN COHERENT OPTICAL NETWORKS

(71) Applicant: Infinera Corporation, Annapolis Junction, MD (US)

(72) Inventors: Rajan Rao, Fremont, CA (US); Ashok Kunjidhapatham, Devarachikkanahalli (IN); Ashwini Kumar Bhat, Bangalore (IN); Baranidhar Ramanathan, Kasavanahalli (IN); Sanjeev Ramachandran, Hoysala Nagar (IN); Nikhil Satyarhi, Bengaluru (IN); Saratchandar Adayapalam Viswanathan, Bilekahalli (IN); Biao Lu, Saratoga, CA (US); Amit Satbhaiya, Kundalahalli (IN); Ramnarayan Srinivasan, Bangalore (IN); Ramakrishna Pratapa, Bangalore (IN)

(73) Assignee: Infinera Corporation, Sunnyvale, CA (US)

(*) Notice: Subject to any disclaimer, the term of this patent is extended or adjusted under 35 U.S.C. 154(b) by 0 days.

(21) Appl. No.: 16/000,630

(22) Filed: Jun. 5, 2018

(65) Prior Publication Data
US 2018/0351694 A1 Dec. 6, 2018

Related U.S. Application Data

(60) Provisional application No. 62/515,394, filed on Jun. 5, 2017.

(51) Int. Cl.
*H04L 1/00* (2006.01)
*H04B 10/61* (2013.01)
(Continued)

(52) U.S. Cl.
CPC ...... *H04L 1/0054* (2013.01); *H03M 13/3723* (2013.01); *H04B 10/6165* (2013.01);
(Continued)

(58) Field of Classification Search
CPC ............... H04L 1/0054; H04L 25/067; H03M 13/3723; H04B 10/6165
(Continued)

(56) References Cited

U.S. PATENT DOCUMENTS 8,223,803 B2 7/2012 Sprague
2002/0191247 A1* 12/2002 Lu .......................... H04B 10/03
398/79
(Continued)

OTHER PUBLICATIONS

Mannie, E., "Generalized Multi-Protocol Label Switching (GMPLS) Architecture", RFC 3945, The Internet Society, Oct. 2004.
(Continued)

*Primary Examiner* — Michael R Neff
(74) *Attorney, Agent, or Firm* — David L. Soltz

(57) ABSTRACT

Methods, nodes and control modules are disclosed. In the method, circuitry of a first node in a mesh network converts an optical layer in a working path between the first node and a second node, to a data stream in a digital layer. The working path carries data traffic from the first node to the second node in the optical layer of the mesh network when there is no failure in the working path. Circuitry of the first node in the mesh network detects a failure in the working path due to detection of an error in the data stream in the digital layer. The circuitry of the first node establishes, through transmission of at least one signal from the first node to the second node, a restoration path in the optical layer based on, at least in part, detection of the error in the data stream in the digital layer.

17 Claims, 6 Drawing Sheets

(51) Int. Cl.
 *H03M 13/37* (2006.01)
 *H04L 25/06* (2006.01)
 *H04Q 11/00* (2006.01)
(52) U.S. Cl.
 CPC ............ *H04L 1/004* (2013.01); *H04L 25/067* (2013.01); *H04Q 11/00* (2013.01); *H04Q 11/0001* (2013.01); *H04L 2001/0097* (2013.01)
(58) Field of Classification Search
 USPC ........................................................ 375/329
 See application file for complete search history.

(56) References Cited

U.S. PATENT DOCUMENTS

2012/0224851 A1* 9/2012 Takara ............... H04B 10/0793
398/45
2014/0146663 A1* 5/2014 Rao ........................ H04L 45/28
370/228

OTHER PUBLICATIONS

ITU-T, "Interface for the Optical Transport Network (OTN)", ITU-T G.709 Recommendation, Dec. 2009.
ITU-T, "Architecture of Optical Transport Networks", ITU-T G.872 Recommendation, Nov. 2001.

* cited by examiner

FAST RESTORATION USING SDFEC DEFECTS IN COHERENT OPTICAL NETWORKS

INCORPORATION BY REFERENCE

The present patent application claims priority to Provisional Patent Application U.S. Ser. No. 62/515,394 titled Fast Restoration using Soft Decision Forward Error Correction (SDFEC) Defects in Coherent Optical Networks, filed on Jun. 5, 2017, the entire contents of which are hereby expressly incorporated herein by reference.

FIELD OF THE DISCLOSURE

The disclosure generally relates to methods and apparatuses for optical layer (L0) restoration using a combination of digital fault detection and optical fault detection in coherent optical networks. More particularly the disclosure relates to methodologies for protection and restoration in an optical layer of a coherent optical network using soft decision forward error correction defects. Though the methodologies set forth herein are in the context of traffic engineering (TE) routing in optical transport networks (OTN), such methodologies may be applied to any transport network having a digital layer (L1) and an optical layer (L0).

BACKGROUND

Traffic Engineering (TE) is a technology that is concerned with performance optimization of operational networks. In general, Traffic Engineering includes a set of applications mechanisms, tools, and scientific principles that allow for measuring, modeling, characterizing and control of user data traffic in order to achieve specific performance objectives.

Generalized Multiprotocol Label Switching (GMPLS) is a type of protocol which extends multiprotocol label switching to encompass network schemes based upon time-division multiplexing (e.g. SONET/SDH, PDH, G.709), wavelength multiplexing, and spatial switching (e.g. incoming port or fiber to outgoing port or fiber). Multiplexing, such as time-division multiplexing is when two or more signals or bit streams are transferred over a common channel.

Generalized Multiprotocol Label Switching includes multiple types of label switched paths including protection and recovery mechanisms which specifies predefined (1) working connections within a mesh network having multiple nodes and communication links for transmitting data between a headend node and a tailend node; and (2) protecting connections specifying a different group of nodes and/or communication links for transmitting data between the headend node to the tailend node in the event that one or more of the working connections fail. Working connections may also be referred to as working paths. Protecting connections may also be referred to as recovery paths and/or protecting paths and/or protection paths. A first node of a path may be referred to as a headend node or a source node. A last node of a path may be referred to as a tailend node or end node or destination node. The headend node or tailend node initially selects to receive data over the working connection (such as an optical channel data unit label switched path) and then, when a working connection fails, the headend node or tailend node selects a protecting connection for passing data within the mesh network. The set up and activation of the protecting connections may be referred to as restoration or protection.

A Super Channel is a group of wavelengths sufficiently spaced so as not to cause any interference among the group of wavelengths which are sourced from a single light source and managed as a single grouped entity for routing and signaling in an optical network.

Restoration at optical layer (L0 layer) provides an efficient mechanism through which data transport can be offered a considerable degree of resiliency against failures in the network. The current state of the art implementations for optical restoration at L0 layer use faults generated in the optical layer to trigger the restoration in cases of failures. Since both the detection and propagation mechanism of optical faults for a super-channel through an optical supervisory channel (OSC) is slow inherently due to optical power monitoring device (OPM) limitations and network latencies, the existing triggers delay the restoration mechanism. In some cases local photo-diodes are monitored using optical loss of signal (OLOS) triggers harnessed as fast restoration triggers, but optical loss of signal triggers cannot be reliably used in case of slice able light sources from which multiple super-channels can originate. Furthermore in systems where drop filters are missing, a failure on the super-channel might not manifest in optical loss of signal condition on the photo-diode since the optical loss of signal trigger from the photo-diode can happen only when the complete band has OLOS and not when a single super-channel dies in existence with other super-channels still being live. In cases of failure in the network it is highly desirable to achieve faster restoration to minimize the traffic outage. The following discusses some of the options used in the prior art to monitor the health of the optical channels and achieve restoration at the L0 layer.

In case of optical layers, a typical device which can monitor the health of an optical channel is an optical power monitor device (OPM). An OPM can monitor the power levels for the range of the spectrum of the optical channel. But, due to the limitations in the physical design an OPM usually takes a large amount of time to measure the power of the spectrum which is in order of seconds. Typically OPMs are placed on reconfigurable optical add drop multiplexer (ROADM) cards where multiplexing of multiple optical channels are done to form a complete C/L-band and where optical power controls are run for each optical channel. Hence, placing the OPM in a ROADM card is more cost efficient from an overall design point of view. Furthermore, optical power detection by the OPM cannot conclusively say that the end digital traffic is down and hence no such threshold based rule based on expected power can be applied to detect a fault as it might still be possible that the digital traffic can be extracted error-free on the card where the digital transport client is demodulated from an optical channel even though the threshold based rule concludes that the optical channel is down. Only for conditions where there is a complete loss of light condition detected in the power measured for an optical channel, can it be conclusively said that the channel is down. Conversely, in cases of high accumulated noise in case of longer links especially with Raman amplifiers, the OPM device measurements can conclude that there is a sufficient power on the optical channel even though it is not possible to extract the digital traffic from the optical channel.

Hence, to conclude if an OPM device is used to measure an optical channel health, the fault reporting to the L0 restoration engine is delayed and is also not reliable in many of cases. Hence, the sole OPM based health monitoring scheme for L0 optical protection cannot help achieve optical restoration.

Another solution which is used in the prior art to achieve L0 optical restoration is by using low cost photo-diodes (PD) to monitor the health of optical channels and use signals from the photo-diodes to trigger the restoration engine. Typically one can put a PD on the LS card, i.e., the card where the digital transport client is modulated/demodulated to/from an optical channel. Since, PD monitoring can detect power changes quickly, the restoration engine can be quickly notified to act when an optical channel suffers a failure. Hence, faster restoration can be achieved. Typically a sophisticated ROADM card filters out the optical channel from the complete band and hence when the optical channels suffers a fault condition an optical loss of signal can be detected on the LS card. But there are cases where many low cost ROADMs can't filter out the optical channel from the complete band and the filtering is done eventually on the LS card. Such deployments make more sense in terms of cost effectiveness of the overall network. Hence, for such deployments an optical channel fault will not reflect as an optical loss of signal on photodetector of the LS card and hence restoration triggers will be completely absent in such cases. LS card photodetector optical loss of signal triggers can be used in cases of a failure on the complete band, but when the band carries multiple optical channels and some channels are operational while other channels are not, the photo-diode won't reflect an OLOS condition and hence the triggers would be completely absent for the restoration engine to act on. In such cases optical restoration can't be achieved just by monitoring the PD on the LS card. Hence, though LS card PD monitoring can help in achieving fast fault triggers for optical protection but not all network level faults reflect as PD OLOS on the LS card in some systems.

Furthermore in some systems a LS can source and sink multiple-SCHs where each of the SCHs sourced can go to different degrees through the ROADM card. This is a more efficient architecture in term of cost and with respect to L0 restoration considerations because the super channel can be dynamically routed to different degrees based on failure conditions. In such LS cards (sliceable LS card), even though the ROADM has drop filters, the LS card PD still monitors multiple-SCHs and hence the super-channel on which restoration is required as a consequence of fault in the network, might not manifest as an optical loss of signal condition on the LS card PD.

Another prior art mechanism which can be used as fault trigger for L0 optical restoration can be optical layer defect propagation faults (faults from the optical supervisory channel). Optical layer defect propagation (OLDP) is a fault propagation mechanism in the optical layer for operations and maintenance considerations to facilitate protection or restoration using overhead frames mapped to the optical supervisory channel. In this case, an optical channel level forward defect indication payload (FDI-P) or optical connection indication (OCI) can act as a trigger to the restoration engine. But since the overhead monitoring bytes carried through the optical supervisory channel are tapped at each optical node in the network and propagated in the downstream optical supervisory channel, it might take a large amount of time for the OLDP faults to surface at the drop node where the restoration logic might run and act as a trigger. Hence, OLDP faults can be used by the restoration engine but is a slower trigger due to network latency issues. An implementation can be built wherein the OLDP fault propagation can be done all the way in the FPGA or some hardware in all the upstream nodes but this would increase the cost of the equipment prohibitively and hence is not a practical deployment. Furthermore, downstream to the last optical express hop in the upstream any subsequent degradation suffered by the optical channel will not reflect as an OLDP fault since the optical channel level health monitoring is done on the express hop only. The optical amplifier (OA) equipment downstream to the express hop does not have the understanding of an optical channel as the optical amplifier equipment just has a notion of the band only. Hence, OLDP can't cover the last hop degradation problem for an optical channel.

To summarize OPM monitored channel conditions are not sufficient triggers for optical layer restoration and for the cases where the OPM monitored channel conditions are sufficient, the triggers can be very slow due to the OPM device limitation. LS PD OLOS can help to achieve fast restoration triggers but OLOS conditions may not surface in many fault conditions in the network where only the optical channel which needs to be restored is dead but other optical channel are alive. OLDP faults can act as fault triggers but are very slow unless cost prohibitive equipment is used. Also OLDP faults can't be used for last hop degradation issues.

Hence, there is a need to achieve optical channel restoration in a faster and less cost prohibitive manner. The present document discloses an approach to trigger the optical restoration in a faster and less cost prohibitive manner.

SUMMARY

A method and system are disclosed. The problem of unreliable and expensive mechanisms for addressing failures in the optical layer, is addressed through methods and systems that convert optical signals into digital signals and conduct fault monitoring at both the optical layer and the digital layer.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

Figure 1:
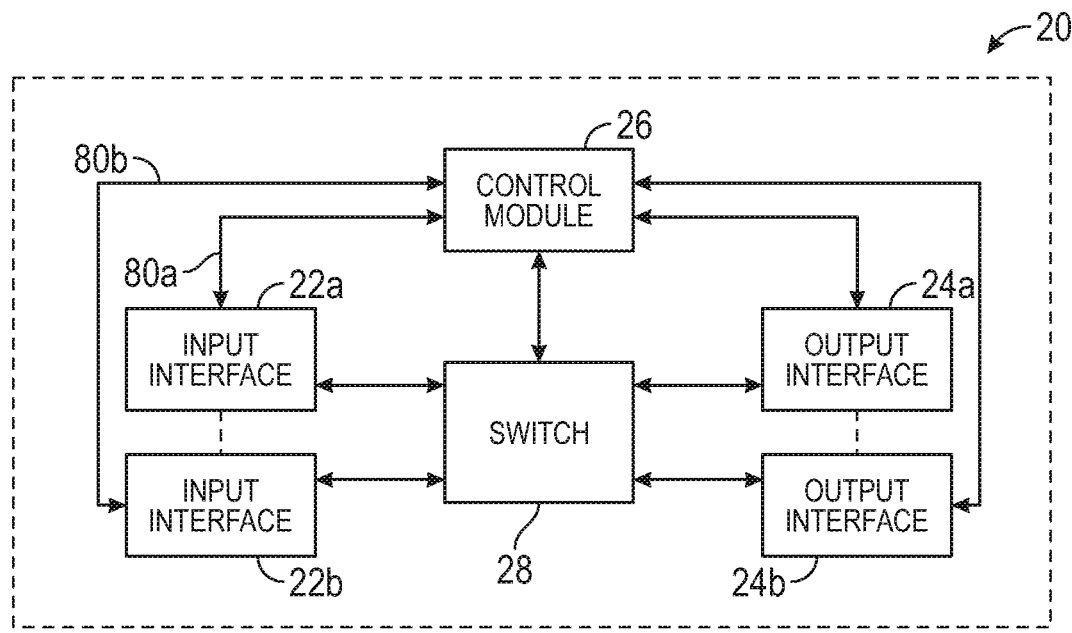
FIG. 1 is a block diagram of an exemplary node constructed in accordance with the present disclosure for communicating via a mesh network.

The following detailed description refers to the accompanying drawings. The same reference numbers in different drawings may identify the same or similar elements.

The mechanisms proposed in this disclosure circumvent the problems described above. To solve the slow fault trigger issue and to handle non-reliability with respect to the mechanisms as described in the background, the present disclosure detects digital layer fault triggers, such as an error in a data stream in the digital layer. The error can be a soft decision forward error correction defect detected by a soft decision forward error correction algorithm. These digital layer fault triggers can be monitored by hardware, such as in field programmable gate arrays and application specific integrated circuits and accomplished at both an add end, and a drop end. Hence, a local restoration engine can be quickly informed about the failure condition, determine a restoration path, and signal other nodes in the restoration path to create the restoration path.

In some embodiments, the present disclosure describes methods and systems for converting, by circuitry of a first node in a mesh network, an optical layer in a working path between the first node and a second node, to a data stream in a digital layer, wherein the working path carries data traffic from the first node to the second node in the optical layer of the mesh network when there is no failure in the working path. The circuitry of the first node in the mesh network, detects a failure in the working path due to detection of an error in the data stream in the digital layer. Upon detection of an error in the data stream, the circuitry of the first node, establishes a restoration path in the optical layer.

In one embodiment, the failure of the working path is detected by monitoring one or more parameters of the optical layer, and also by monitoring the data stream in the digital layer. The one or more parameters of the optical layer include at least one of an optical layer defect propagation status message, an optical power monitoring device, and a power level of the optical layer detected by a photo diode.

In one embodiment, the error in the data stream in the digital layer is detected with a forward error correction algorithm, such as a soft decision forward error correction algorithm.

In one embodiment, the circuitry of the first node in the mesh network comprises a L0 restoration engine monitoring first faults detected in the optical layer, and the error in the data stream in the digital layer. In some embodiments, the circuitry of the first node further comprises a route selection module, and a signaling engine. The L0 restoration engine establishes the restoration path, by signaling the route selection module to cause the route selection module to determine the restoration path, and signals the signaling engine to cause the signaling engine to transmit at least one signal from the first node to the second node.

Definitions

If used throughout the description and the drawings, the following short terms have the following meanings unless otherwise stated:

Band: The complete optical spectrum carried on the optical fiber. Depending on the fiber used and the supported spectrum which can be carried over long distances with the current technology, relevant examples of the same are: C-Band/L-Band/Extended-C-Band.

DF (Digital Fault): A fault condition reported by a FEC processing unit after coherent detection in optical transponders (e.g. Line cards). The fault condition may be one of the following:
  a. LOF—Loss of Frame derived based on OOF (out of Frame), OOM (Out of Multi-frame), LOM (Loss of Multi-Frame) defects;
  b. BDI—Backward Defect Indication. This is an indication sent upstream by downstream node detecting LOF. This information is carried in a SDFEC overhead which may be processed by overhead monitoring unit.

FEC—stands for Forward Error Correction.

GMPLS stands for Generalized Multi-Protocol Label Switching which extends Multi-Protocol Label Switching to encompass time-division (for example, SONET/SDH, PDH, G.709), wavelength (lambdas), and spatial multiplexing (e.g., incoming port or fiber to outgoing port or fiber). The GMPLS framework includes a set of routing protocols which runs on a control module. The Generalized Multiprotocol Label Switching architecture is defined, for example in RFC 3945.

IETF stands for Internet Engineering Task Force.

IP stands for Internet Protocol which is a protocol used for communicating data across a packet-switched internetwork using the Internet Protocol Suite, also referred to as TCP/IP.

LSP stands for Label Switched Path which is a path through a Generalized Multi-Protocol Label Switching network. Note that Label Switched Paths can be bidirectional or unidirectional; they enable packets to be label switched through the Multiprotocol Label Switched network from a port on an ingress node (which can be called a headend node) to a port on an egress node (which can be called a tailend node).

LS (Light source): A card where the digital transport client is modulate/de-modulated to/from an optical channel. This is the place where the optical channel originates/terminates.

MPLS stands for multi-protocol label switching which is a scheme in telecommunications networks for carrying data from one node to the next node. MPLS operates at an OSI model layer that is generally considered to lie between traditional definitions of layer 2 (data link layer) and layer 3 (network layer) and is thus often referred to as a layer 2.5 protocol.

OA (Optical Amplifier) stands for a band control gain element generally EDFA or RAMAN based.

OAM stands for Operation, Administration and Maintenance, a standardized terminology in transport networks used to monitor and manage the network.

OLDP (Optical Layer Defect Propagation) stands for a fault propagation mechanism in the optical layer for OAM considerations and to facilitate protection or restoration using the overhead frames mapped to an OSC.

OPM (Optical Power Monitor device) stands for a device having a capability to monitor power on a per slice basis.

OSC (Optical Supervisory Channel) stands for an additional wavelength usually outside the amplification band (at 1510 nm, 1620 nm, 1310 nm, etc.). The OSC carries information about the multi-wavelength optical signal as well as remote conditions at the optical add/drop or OA sites. It is used for OAM in DWDM networks. It is the multi-wavelength analogue to SONET's DCC (or supervisory channel).

OTN stands for Optical Transport Network which includes a set of optical switch nodes which are connected by optical fiber links. ITU-T recommendations G.709 and G.872 define OTN interface requirements and network architecture respectively.

PCC stands for Protection Communication Channel.

PD (Photo-Diode) stands for a device which can measure the power levels in the complete band.

SCH (Super Channel/Optical Channel) stands for a group of wavelengths sufficiently spaced so as not to cause any interference among the group of wavelengths. The group of wavelengths may be sourced from a single light source and managed as a single grouped entity for routing and signaling in an optical network.

Slice stands for an N GHz (N=12.5, 6.25, 3.125) spaced frequency band of the whole of the optical spectrum each such constituent band is called a slice. A slice is the resolution at which the power levels can be measured by the optical power monitoring device. The power level being measured by the optical power monitoring device represents the total optical power carried by the portion of the band represented by that slice. A super-channel pass-band is composed of a set of contiguous slices.

TE stands for Traffic Engineering which is a technology that is concerned with performance optimization of operational networks. In general, TE includes a set of applications mechanisms, tools, and scientific principles that allow for measuring, modeling, characterizing and control of user data traffic in order to achieve specific performance objectives.

WSS (Wavelength Selective Switch) is a component used in optical communications networks to route (switch) optical signals between optical fibers on a per-slice basis. Generally power level controls can also be done by the WSS by specifying an attenuation level on a pass-band filter. A wavelength Selective Switch is a programmable device having source and destination fiber ports where the source and destination fiber ports and associated attenuation can be specified for a pass-band.

DESCRIPTION

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or more and the singular also includes the plural unless it is obvious that it is meant otherwise.

Further, use of the term "plurality" is meant to convey "more than one" unless expressly stated to the contrary.

Finally, as used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Figure 2:
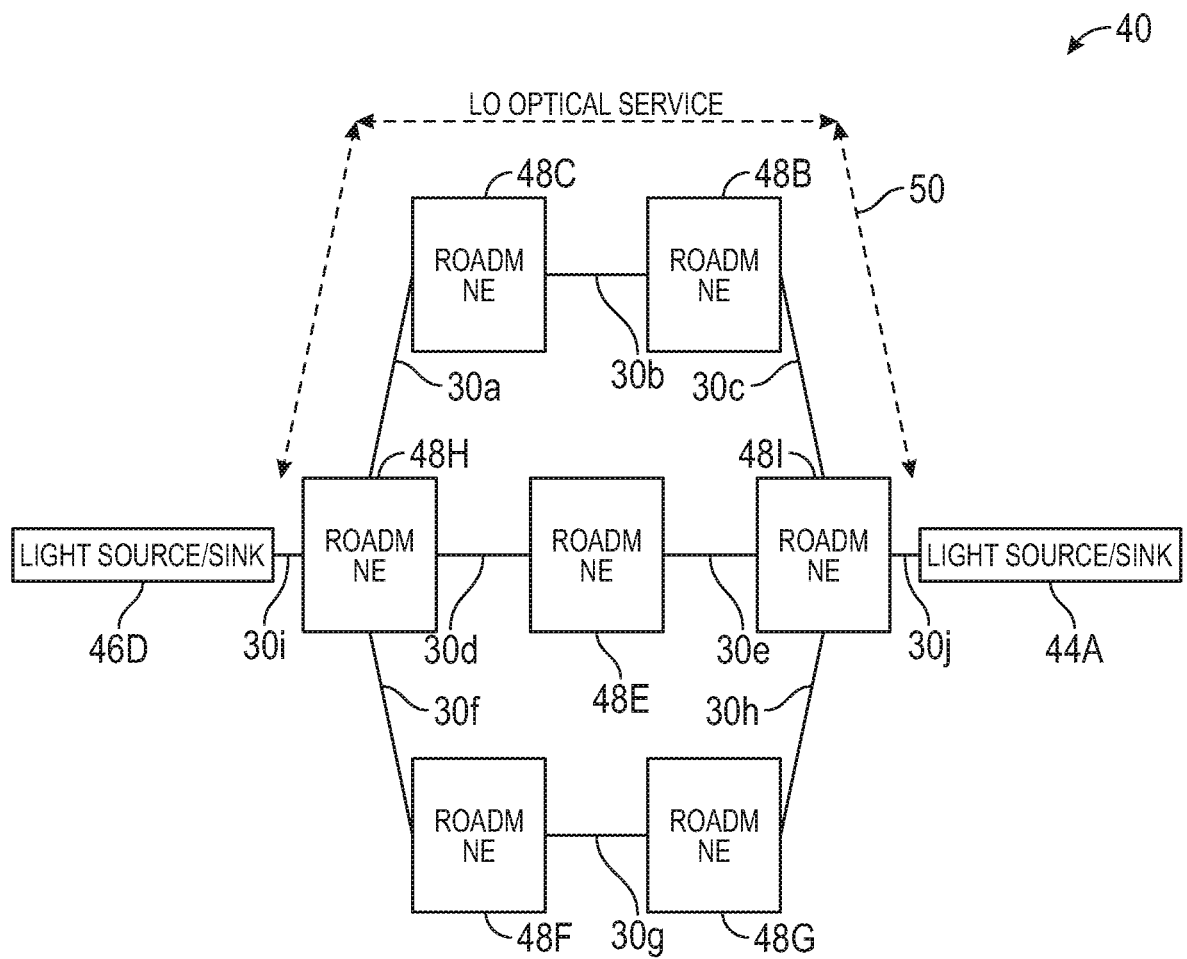
FIG. 2 is a schematic diagram of an exemplary mesh network showing a working path within the mesh network.

Referring now to the drawings, and in particular to FIG. 1, shown therein and designated by reference numeral 20 is a block diagram of an exemplary node constructed in accordance with the present disclosure. The node 20 is adapted to facilitate the communication of data (which may be referred to herein as "traffic" and/or "data traffic") between multiple nodes 20 in a mesh network 40, as shown in FIG. 2. The mesh network 40 may be, for example, an optical transport network (OTN).

The node 20 is provided with one or more input interfaces 22, one or more output interfaces 24, a control module 26, and a switch 28. In general, the input interfaces, shown here as 22a and 22b, are adapted to receive traffic from the mesh network 40, and the output interfaces, shown here as 24a and 24b, are adapted to transmit traffic onto the mesh network 40 (see FIG. 2). The switch 28 serves to communicate the traffic from the input interfaces 22a and 22b, to the output interfaces 24a and 24b. And, the control module 26 serves to control the operations of the input interfaces 22a and 22b, the output interfaces 24a and 24b, and the switch 28, as well as to set up label switched paths within the mesh network 40. The node 20 may also include non-transitory memory (not shown), either within the control module 26 and/or the switch 28, or separate from the control module 26 and/or the switch 28.

The node 20 can be implemented in a variety of ways, including, commercial installations having one or more backplanes (not shown), racks, shelves, and the like. In this example, the input interface(s) 22, the output interface(s) 24, the control module 26 and the switch 28 are typically implemented as separate devices, which may have their own power supply, local memory and processing equipment. In another example, the node 20 can be implemented as a single device having a shared power supply, memory and processing equipment. Or, in another example, the node 20 can be implemented in a modular manner in which one or more of the input interface(s) 22, the output interface(s) 24, the control module 26 and the switch 28 share a power supply and/or housing.

The input interface(s) 22 and the output interface(s) 24 of one node 20 are adapted to communicate with corresponding input interface(s) 22, and output interface(s) 24 of another node 20 within the mesh network 40 via communication links 30, as shown in FIG. 2. The mesh network 40 depicted in FIG. 2 may be a subnetwork of an optical transport network having an optical layer (L0) and at least one digital layer (L1). In the example shown, the mesh network 40 is a part of the optical layer, having interconnections with another part of the optical transport network being a digital layer (L1). For purposes of brevity, only the optical layer (L0) is shown in FIG. 2. An example of an input interface 22 and/or an output interface 24 is a light source/sink, i.e., a card where a digital transport client is modulated/demodulated to/from an optical channel. In general, each of the input interface(s) 22 and/or the output interface(s) 24 may have a unique logical identification, such as an IP address. The communication links 30 can be implemented in a variety of ways, such as a physical link including optical signal (e.g., optical fiber or other waveguide) carrying capabilities. In other words, the communication links 30 can be fiber optic cables.

The implementation of the input interface(s) 22, and the output interface(s) 24, however, will depend upon the particular type of communication link 30 that the particular input interface 22 and/or output interface 24 is designed to communicate with. For example, one of the input interfaces 22 can be designed to communicate wirelessly with another node 20 within the optical transport network, while one of the output interfaces 24 of the node 20 can be designed to communicate optically through a fiber-optic link. For a particular node 20, the input interfaces 22a and 22b can be of the same type or different types; the output interfaces 24a and 24b can be of the same type or different types; and the input interface(s) 22 and output interface(s) 24 can be of the same type or different types.

The input interface 22 and the output interface 24 are shown separately for purposes of clarity. However, it should be understood that one or more of the input interfaces 22 and/or the output interfaces 24 could be connected to a single communication link 30 and implemented as a single device, such as a line module. Exemplary line modules and nodes are described in U.S. Pat. No. 8,223,803 (Application Publication number 20090245289), entitled "Programmable Time Division Multiplexed Switching," the entire contents of which are hereby incorporated herein by reference. Further, it should be understood that the node 20 can be implemented in a variety of manners.

A schematic diagram of the exemplary mesh network 40 is shown in FIG. 2, by way of example. In FIG. 2, the mesh network 40 includes nodes 20 labeled as A, B, C, D, E, F, G, H and I. Some of the nodes 20 are denoted as a source node 44 or destination node 46 for a particular path in accordance to the path setup direction. Other nodes 20 are known as intermediate nodes 48. In this example, the mesh network 40 includes source node 44-A; destination node 46-D; and intermediate nodes 48-B, 48-C, 48-E, 48-F, 48-G, 48-H, and 48-I connected by links 30a-30j. In this example, the node 48-I may also be denoted as a head end node, and the node 48-H may also be denoted as a tail end node. The source node 44-A may be a part of or separate from the node 48-I; and the destination node 46-D may be a part of or separate from the node 48-H.

In accordance with the present disclosure, messages transmitted between the nodes 20 can be processed by circuitry within the input interface(s) 22, and/or the output interface (s) 24 and/or the control module 26. Circuitry could be analog and/or digital, components, or one or more suitably programmed microprocessors and associated hardware and software, or hardwired logic. Also, certain portions of the implementations have been described as "components" that perform one or more functions. The term "component," may include hardware, such as a processor, an application specific integrated circuit (ASIC), or a field programmable gate array (FPGA), or a combination of hardware and software. Software includes one or more computer executable instructions that when executed by one or more component cause the component to perform a specified function. It should be understood that the algorithms described herein are stored on one or more non-transitory memory. Exemplary non-transitory memory includes random access memory, read only memory, flash memory or the like. Such non-transitory memory can be electrically based or optically based. Further, the messages described herein may be generated by the components and result in various physical transformations.

FIG. 2 also illustrates the exemplary mesh network 40 depicted in FIG. 2 including a working path 50 providing L0 optical service. In this example, the working path 50 is formed by the communication links 30j, 30c, 30b, 30a and 30i and nodes {44-A, 48-I, 48-B, 48-C, 48-H, and 46-D}. The working path 50 can be established by the nodes A-I prior to any network failure, for example, by using GMPLS protocols. The working path 50 may be bi-directional or co-routed. The working path 50 initially carries data traffic and continues to carry data traffic while there is no failure on the working path 50. The working path 50 can be non-restorable, non-revertive or revertive. Revertive means that the data traffic is directed back to the working path 50 after the working path 50 is restored. Non-revertive restoration means that the data traffic is not directed back to the working path 50 after the working path 50 is restored.

Figure 4:
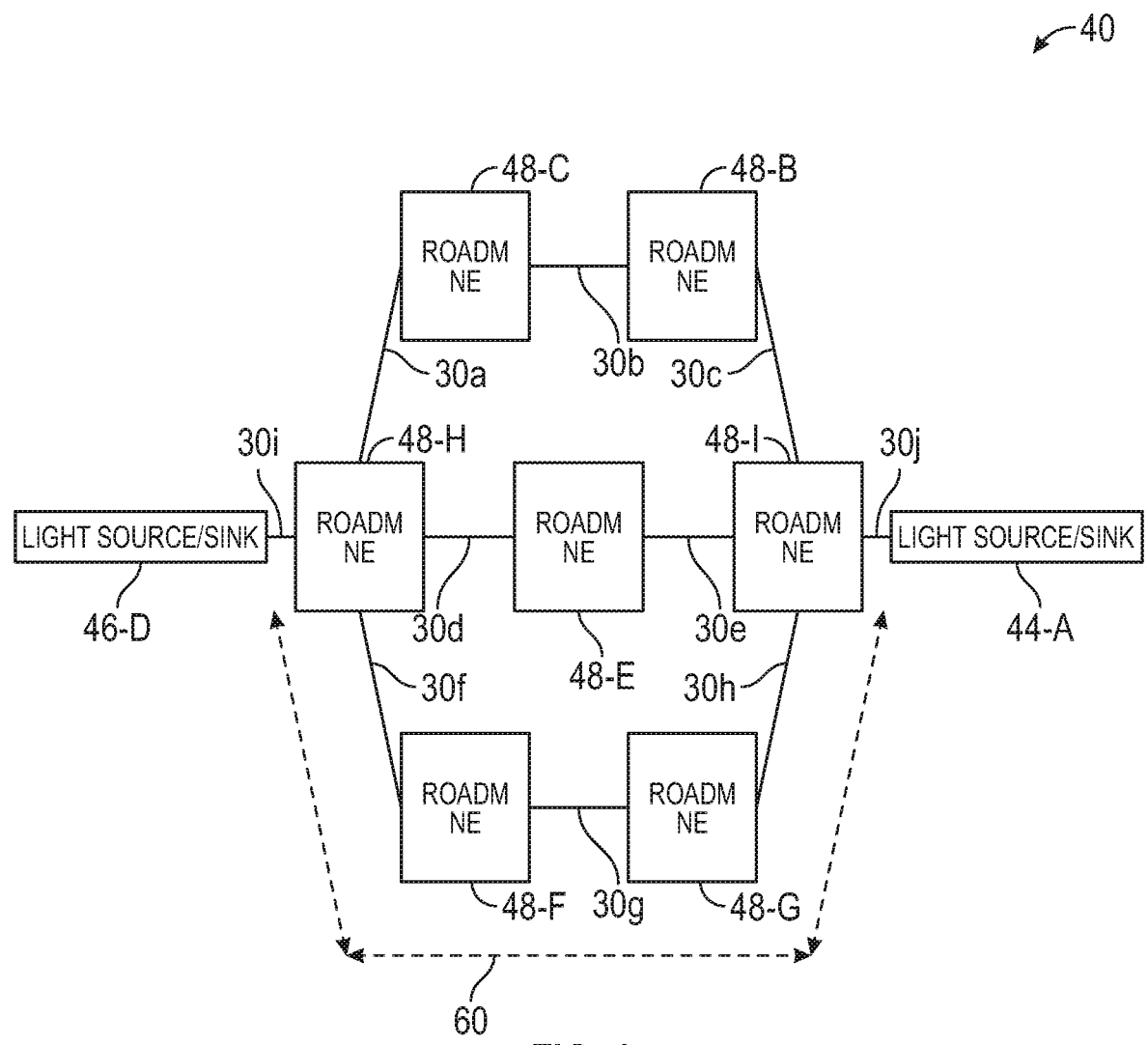
FIG. 4 is a schematic diagram of the exemplary mesh network of FIG. 2 in which a recovery path has been computed and established in the mesh network.

In some embodiments, all of the nodes A-I are responsible for detecting a failure of the working path 50. Once any of the nodes A-I detects a defect in the working path 50, the node that detected the failure may automatically initiate recovery action by computing a restoration path 60 (as depicted in FIG. 4), and signaling the other nodes A-I to create the restoration path 60. The mechanisms used to detect the failure of the working path 50 in accordance with the present disclosure, are discussed below.

In general, during setup, network resources, for example, nodes A-I, communication links 30a-30j, and wavelength/slices (not shown), are specified for each path. The working path 50 is activated with the appropriate resources on the intermediate nodes 48-I, 48-B, 48-C, and 48-H. The resource assignment may be a part of the control-plane Connection Admission Control (CAC) operation taking place on each node A-I.

In general, logical tables in one or more databases 66 (see FIG. 8) may be used to support restoration path 60 computations and creation logic. Preferably, the tables include one or more connection tables, one or more logical slice/wavelength tables, and one or more real slice/wavelength tables. The connection table(s) maintains the connection-related information, including labels, interfaces, and associated slice/wavelength information for the connections. The real table(s) maintains the slice/wavelength related information, including the active connections that are currently conveying traffic and any reserved connections for all slices or wavelength. A reserved connection means there is not any active traffic on the slice/wavelength. In the situation where the restoration path 60 is identified in the connection table, the restoration path's 60 associated slices/wavelengths can be readily discovered utilizing the logical table and the real table.

Figure 3:
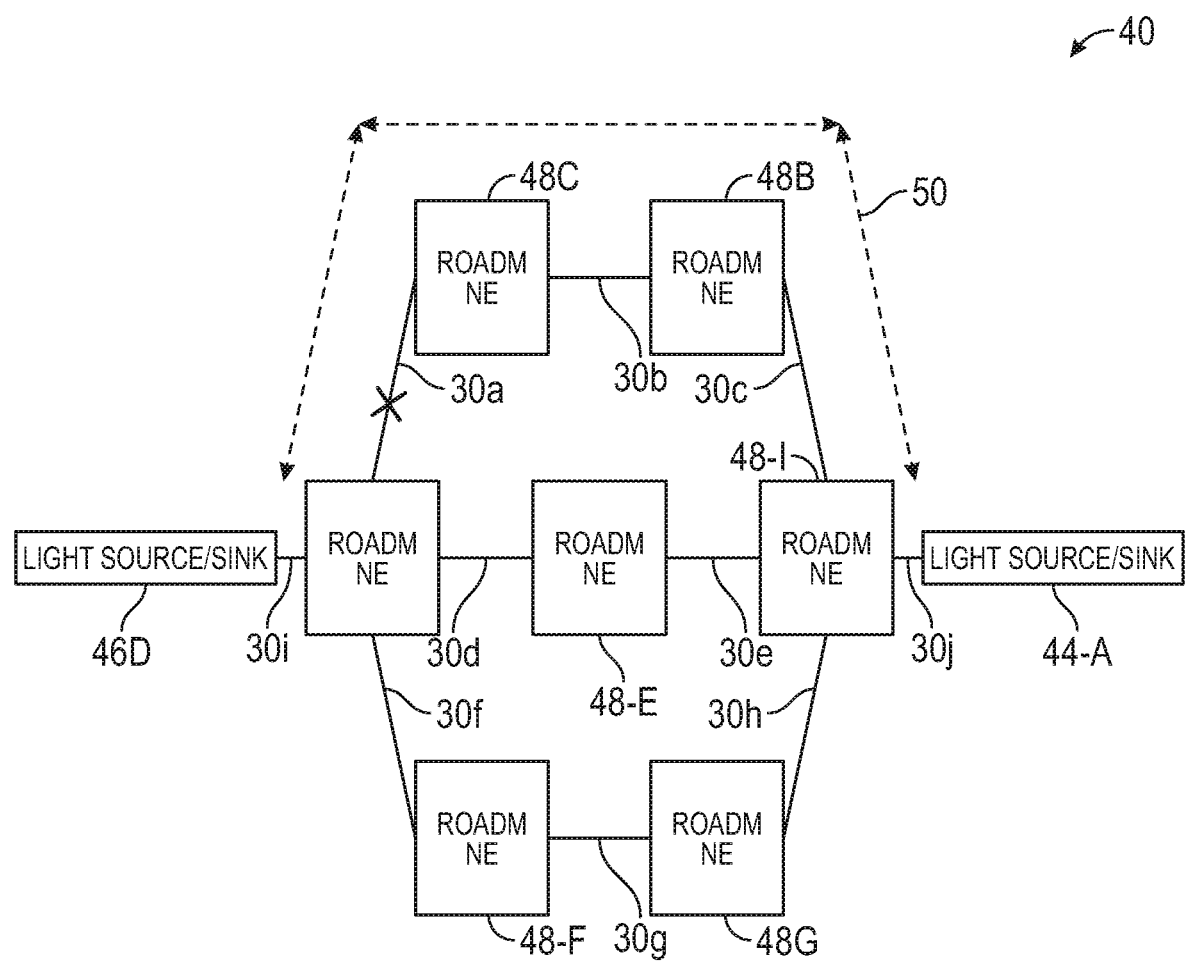
FIG. 3 is a schematic diagram of the exemplary mesh network of FIG. 2 in which a failure has occurred in the working path.

Upon detection of working path 50 failure as depicted in FIG. 3 (for example, if the optical properties of communication link 30a between intermediate nodes 48-C and 48-H is degraded to an extent that optical signals are not conveying data traffic in an error-free manner), the node 48I, for example, will detect the failure, compute the restoration path 60 and signal the other nodes A-G, and H to create the restoration path 60, and direct the data traffic through the restoration path 60.

Figure 5:
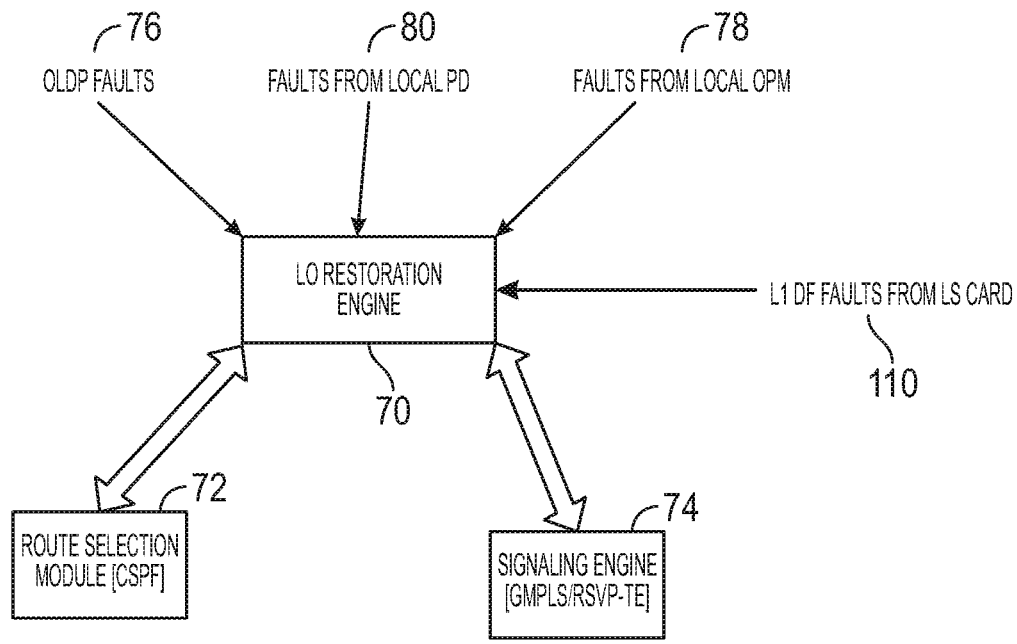
FIG. 5 is a schematic diagram of an optical layer restoration engine configured to receive faults detected within an optical layer and SDFEC digital layer in accordance with the present disclosure.

As shown in FIG. 5, the control module 26 of the node 20 may include a L0 restoration engine 70, a route selection module 72 and a signaling engine 74. The L0 restoration engine 70 is configured to monitor at least one fault detected in the optical layer, and at least one fault detected in a digital layer. Once a fault is detected (either in the optical layer or the digital layer), the L0 restoration engine 70 establishes the restoration path, by signaling the route selection module 72 to cause the route selection module 72 to determine the restoration path 60, and by signaling the signaling engine 74 to cause the signaling engine 74 to transmit at least one signal to other nodes in the mesh network 40 to create the restoration path 60 and direct data traffic onto the restoration path 60.

As shown in FIG. 5, the failure of the working path 50 may be detected by monitoring at least one parameter of the optical layer. As shown in FIG. 5, the L0 restoration engine 70 may monitor three different types of parameters detected in the optical layer to determine whether or not a failure in the working path 50 has occurred. For example, the parameters of the optical layer may include at least one of an optical layer defect propagation status message 76, a fault message 78 from an optical power monitoring device (not shown), and a fault message 80 from circuitry interpreting signals from a photo diode (not shown) in the complete band. The optical layer defect propagation status message 76 may be detected by one of the input interfaces 22a or 22b, and passed to the L0 restoration engine 70 of the control module 26 by way of signal path 80a or 80b. The input interfaces 22a or 22b may include an optical power monitoring device and/or a photo diode used to detect faults. When a fault is detected by the optical power monitoring device and/or circuitry receiving an electrical signal from the photo diode, the messages 78 or 80 are passed to the L0 restoration engine 70 to enable the creation of the restoration path 60.

In some embodiments, the node 20 includes a reconfigurable optical add drop multiplexer (ROADM) card used for multiplexing/de-multiplexing a large number of optical channels to/from the band which in essence achieves the wavelength multiplexing in the L0 layer. Typically the ITU-T G.709 compliant OMS section is formed at the ROADM card. The ROADM card is associated with an optical supervisory channel card where a supervisory channel is added in the output interface 24 (i.e., transmit direction) or tapped by the input interface 22 (i.e., a receive direction). Typically the ITU-T G.709 compliant OTS section is formed at the OSC card. The OSC card and the ROADM card may be in the same card, or co-exist in different cards also without restricting the scope of the present disclosure. In digital layers mostly the fault monitoring is done in the FPGA or ASIC or hardware and hence the fault triggers are fast enough when digital layer restoration is deployed. It is easier to recover digital traffic faster than optical traffic in cases of failure. For example, in case of an ODU service which is restorable, the OTU/ODU faults which are monitored in the OTN overhead monitoring device is fast enough and the digital restoration engine is notified about the fault conditions quickly and hence a faster traffic recovery can be achieved.

Figure 6:
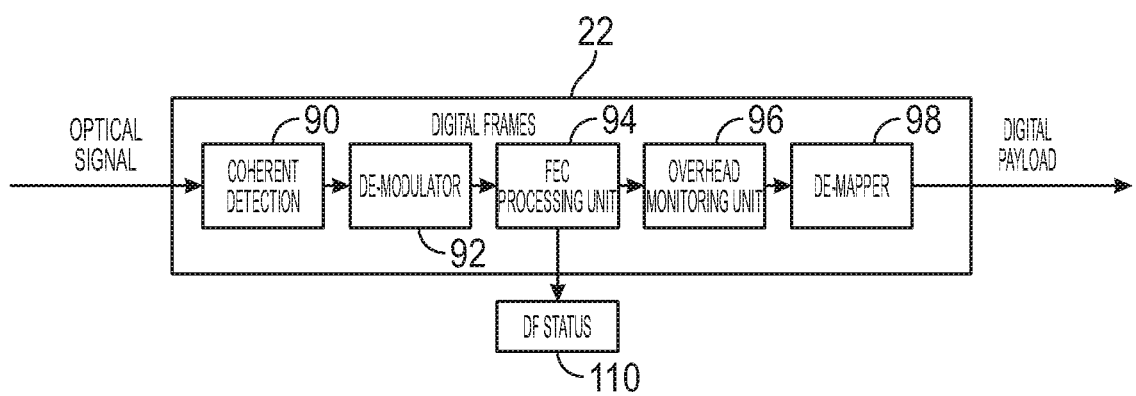
FIG. 6 is a schematic diagram of an input interface converting an optical signal from the optical layer into a digital signal, and providing a digital fault status signal to the optical layer restoration engine in accordance with the present disclosure.

In accordance with the present disclosure, the L0 restoration engine 70 also monitors at least one fault detected in a digital layer. To detect a fault in the digital layer of the network 40, the input interface 22a or 22b, for example, convert data traffic passed within an optical layer in the working path 50 to a data stream in a digital layer. This can be accomplished, for example, using the circuitry depicted in FIG. 6. As shown in FIG. 6, the input interface 22 may include a coherent detection unit 90, a de-modulator unit 92, a forward error correction processing unit 94, an overhead monitoring unit 96, and an optional de-mapper unit 98.

FIG. 6 shows a Digital Fault (DF) status signal 110 generated by the input interface 22 (e.g., LS card). The coherent detection unit 90 converts the optical signals from the optical layer into digital signals having encoded data. The digital signals having encoded data are passed to the de-modulator unit 92 to extract encapsulated digital frames on a client layer specific basis. For each client layer, detection of errors in the digital signals to generate the digital fault status signal 110 may be detected downstream of the de-modulator unit 92. For example, the digital signals may be passed to the forward error correction processing unit 94 to detect and correct any errors within the encapsulated digital frames to form an encapsulated data stream, e.g., a L1 digital data stream having encapsulated data. The output of the forward error correction processing unit 94 is passed to the overhead monitoring unit 96 that is configured to determine whether or not the forward error correction processing unit 94 was successful in correcting any errors. The error, if any, in the data stream in the client specific digital layer can be detected with a forward error correction algorithm, such as a soft decision forward error correction algorithm. If errors exist in the L1 digital data stream, the forward error correction processing unit 94, or the overhead monitoring unit 96 generates the digital fault status signal 110 indicating that a fault exists in the mesh network 40.

If the overhead monitoring unit 96 determines that a fault does not exist, then the L1 digital data stream is then passed to the demapper unit 98. The demapper unit 98 is configured to map the client data to a list to extract a client signal and then send the extracted client signal as a digital payload. The digital payload can be SONET/SDH/Ethernet/FC, etc. when L1 layer is OTN. The digital payload can be PDH (E1/T1/DS1/E3)/Ethernet/ATM, etc when L1 layer is SONET/SDH.

The de-mapper unit 98 is shown in FIG. 6, but it should be understood that the de-mapper unit 98 is optional. Hence, the L1 encapsulated data can either be provided to an L1 switch fabric hosted in another card, for example, or be provided to an L1 specific network. The L1 encapsulation data can be an ODUs in case the L1 layer is OTN. The L1 encapsulation can be by way of a virtual container (VCs) in case the L1 layer is synchronous digital hierarchy (SDH) and synchronous transport signal (STS) in case the L1 layer is a synchronous optical network (SONET). The Digital Frame type is L1 layer specific. Hence can be pre-FEC or post-FEC OTU-LOF (loss of frame)/OTU-LOFLOM/OTU-BDI in case of L1 OTN layer. The Digital Frame type can be section-LOF/section-BDI in case of L1 SONET/SDH layer.

Figure 7:
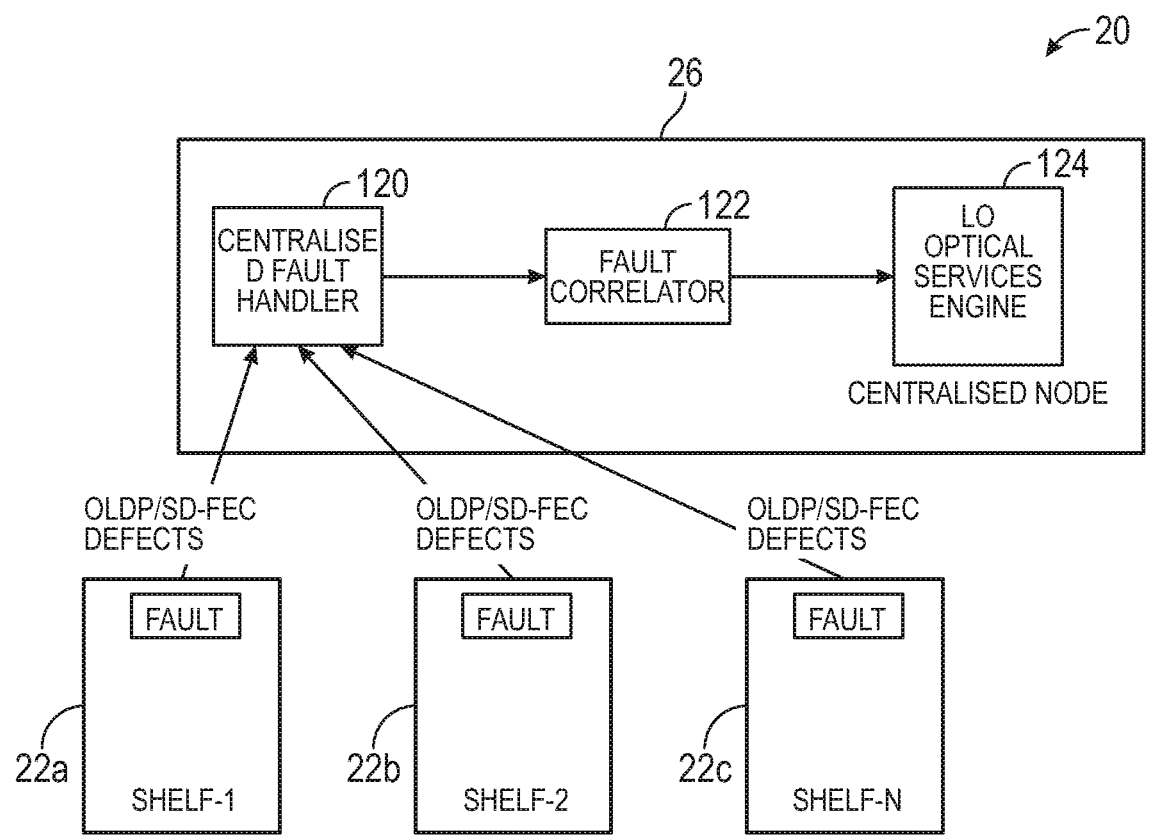
FIG. 7 is a schematic diagram of a control module and three input interfaces of the node of FIG. 1 depicting fault detection circuitry within the input interfaces, and fault handling circuitry within the control module in accordance with the present disclosure.

Shown in FIG. 7 is a block diagram of the node 20 illustrating an exemplary implementation for centralized fault handling for L0 fault detection, and L0 service restoration. In particular, the node 20 includes the control module 26, and three input interfaces 22a, 22b, and 22c. In this example, each of the input interfaces 22a, 22b, and 22c is associated with a particular shelf within a telecommunication rack. The control module 26 can be co-located with the input interfaces 22a, 22b, and 22c, or can be located remotely from the input interfaces 22a, 22b, and 22c. For example, the control module 26 can be remotely located from and in bi-directional communication with the input interfaces 22a, 22b, and 22c. In one example, the control module 26 can be provided as part of an Internet based service. The control module 26 may include a centralized fault handler 120, a fault correlator 122, and an L0 optical services engine 124. Each of the input interfaces 22a, 22b, and 22c would monitor the fault at L0 or SDFEC and the signals indicative of any faults are sent to the centralized fault handler 120. The Centralized Fault Handler 120 would then consolidate the faults and send any consolidated faults to the Fault Correlator 122. At the Fault Correlator 122, the faults from various sources are analyzed and correlated to arrive at a decision of whether to trigger restoration or not. The decision to use a DF status signal to trigger restoration may be made based upon a predetermined user configuration. For example, the configuration can be made at the time of creating the working path 50. If a decision to initiate restoration is made, the L0 Optical Service Engine 124 would register the restorable service entities with the Fault Correlator 122 to get the trigger for restoration. Upon deciding to restore due to the fault along the path, the Fault Correlator 122 would inform the individual L0 optical services engine to trigger restoration to find an alternate path.

Figure 8:
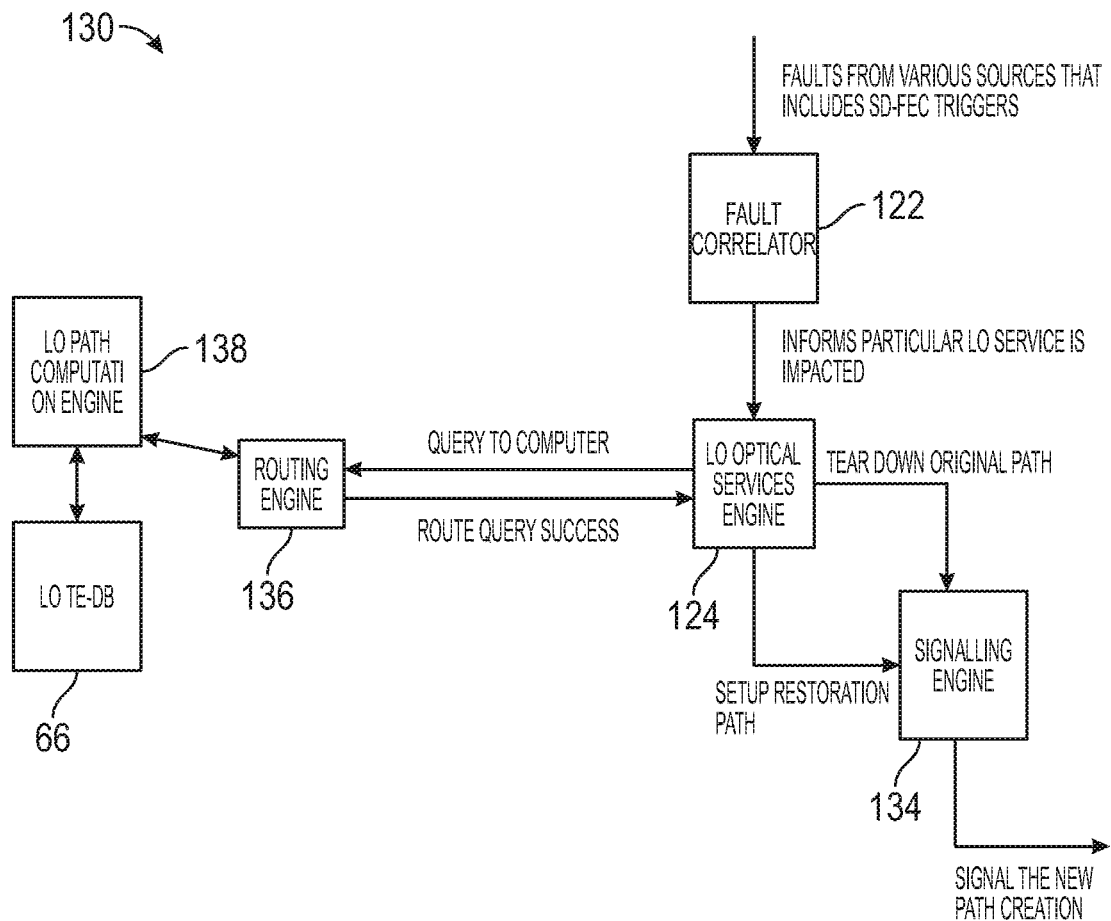
FIG. 8 is an exemplary service restoration flow diagram in accordance with the present disclosure.

Shown in FIG. 8 is a flow chart 130 showing an exemplary methodology for releasing resources for the working path 50 and setting up resources for the restoration path 60. Faults from various sources detected in the L0 optical layer and/or the SDFEC digital layer are provided to the fault correlator 122. The fault correlator 122 determines whether or not to trigger creation of the restoration path 60 and then signals the L0 optical services engine 124 of a particular L0 service that is impacted by the fault, such as the working path 50. Upon receiving the trigger to restore from the fault correlator 122, the L0 Optical Service Engine 124 first tears down the original path (i.e. releases resources) by sending a signaling message to a signaling engine 134 to tear down each cross connection along the original working path 50. Then, the L0 optical services engine 124 requests a Routing Engine 136 to find an alternate path for restoring the traffic. The Routing Engine 136 interacts with a L0 Path Computation Engine 138 to calculate an alternate path that is optically viable. The L0 Path Computation engine 138 interacts with a database 66, such as a L0 TE-DB to get the real-time data of the available Optical Path and wavelength availability in those paths. Upon finding a viable route, the L0 path computation engine 138 and the routing engine 136 responds to the route query request by the L0 Optical Service Engine 124 with the next optically viable path that can be used to restore the traffic. The L0 Optical Service Engine 124 then acts upon the newly calculated path and signals the cross-connection to create the restoration path 60 and direct traffic to the restoration path 60.

CONCLUSION

Conventionally, OPM monitored channel conditions are not sufficient triggers for optical layer protection and for the cases where the OPM monitored channel conditions are sufficient, the triggers can be very slow due to the OPM device limitation. LS PD OLOS can help to achieve fast protection triggers but OLOS conditions may not surface in many fault conditions in the network where only an optical channel is dead but other optical channel are alive. OLDP faults can act as fault triggers but are very slow unless cost prohibitive equipment is used. Also OLDP faults can't be used for last hop degradation issues.

The mechanisms proposed in this disclosure circumvent the problems described above. To solve the slow fault trigger issue and to handle non-reliability with respect to the mechanisms as described in the background, the present disclosure detects digital layer fault triggers, such as an error in a data stream in the digital layer. The error can be a soft decision forward error correction defect detected by a soft decision forward error correction algorithm. These digital layer fault triggers can be monitored by hardware, such as in field programmable gate arrays and application specific integrated circuits and accomplished at both an add end, and a drop end. Hence, a local restoration engine can be quickly informed about the failure condition, determine a restoration path, and signal other nodes in the restoration path to create the restoration path.

The foregoing description provides illustration and description, but is not intended to be exhaustive or to limit the inventive concepts to the precise form disclosed. Modifications and variations are possible in light of the above teachings or may be acquired from practice of the methodologies set forth in the present disclosure.

Even though particular combinations of features are recited in the claims and/or disclosed in the specification, these combinations are not intended to limit the disclosure. In fact, many of these features may be combined in ways not specifically recited in the claims and/or disclosed in the specification. Although each dependent claim listed below may directly depend on only one other claim, the disclosure includes each dependent claim in combination with every other claim in the claim set.

No element, act, or instruction used in the present application should be construed as critical or essential to the invention unless explicitly described as such outside of the preferred embodiment. Further, the phrase "based on" is intended to mean "based, at least in part, on" unless explicitly stated otherwise.

What is claimed is:

1. A method comprising the steps of:
converting, by circuitry of a first node in a mesh network, an optical layer in a working path between the first node and a second node, to a data stream in a digital layer, wherein the working path carries data traffic from the first node to the second node in the optical layer of the mesh network when there is no failure in the working path;
detecting, by circuitry of the first node in the mesh network, a failure in the working path due to detection of an error in the data stream in the digital layer; and
establishing, by circuitry of the first node, through transmission of at least one signal from the first node to the second node, a restoration path in the optical layer based on, at least in part, detection of the error in the data stream in the digital layer, wherein the error in the data stream in the digital layer is detected with a forward error correction algorithm.

2. The method of claim 1, wherein the failure of the working path is detected by monitoring one or more parameters of the optical layer, and by monitoring the data stream in the digital layer.

3. The method of claim 2, wherein the one or more parameters of the optical layer include at least one of an optical layer defect propagation status message, power of an optical channel measured by an optical power monitoring device, and a power level in the optical layer detected by a photo diode.

4. The method of claim 1, wherein the forward error correction algorithm is a soft decision forward error correction algorithm.

5. The method of claim 1, wherein the circuitry of the first node in the mesh network comprises a restoration engine monitoring first faults detected in the optical layer, and the error in the data stream in the digital layer.

6. The method of claim 5, wherein the circuitry of the first node further comprises a signaling engine, and wherein the restoration engine establishes the restoration path, by determining the restoration path, and by signaling the signaling engine to cause the signaling engine to transmit at least one signal from the first node to the second node.

7. A node, comprising:
an input interface having first circuitry to convert a signal in an optical layer in a working path of a mesh network between a first node and a second node, to a data stream in a digital layer, wherein the working path carries data traffic from the first node to the second node in the optical layer when there is no failure in the working path, to detect a failure in the working path due to detection of an error in the data stream in the digital layer and to generate a digital fault signal;

an output interface; and one or more control module controlling the input interface, the control module having second circuitry configured to:

receive the digital fault signal and establish a restoration path in the mesh network by transmitting a signal to another node in the mesh network, wherein the circuitry uses a forward error correction algorithm stored on a non-transitory computer readable medium to detect the error in the data stream in the digital layer.

8. The node of claim 7, wherein the failure of the working path is detected by the first circuitry monitoring one or more parameters of the optical layer, and by monitoring the data stream in the digital layer.

9. The node of claim 8, wherein the one or more parameters of the optical layer include at least one of an optical layer defect propagation status message, power of an optical channel measured by an optical power monitoring device, and a power level in the optical layer detected by a photo diode.

10. The node of claim 7, wherein the forward error correction algorithm is a soft decision forward error correction algorithm.

11. The node of claim 7, wherein the second circuitry comprises a restoration engine monitoring first faults detected in the optical layer, and the error in the data stream in the digital layer.

12. The node of claim 11, wherein the second circuitry further comprises a signaling engine, and wherein the restoration engine establishes the restoration path, by determining the restoration path, and by signaling the signaling engine to cause the signaling engine to transmit at least one signal.

13. A control module, comprising:

a signaling engine configured to create the restoration path; and a restoration engine configured to use a forward error correction algorithm to detect a first fault in an optical layer in a working path of a mesh network between the first node and the second node, and a second fault in a data stream in a digital layer of the mesh network, wherein the working path carries data traffic from the first node to the second node in the optical layer when there is no failure in the working path, the restoration engine configured to establish the restoration path upon detection of the first fault or the second fault and by signaling the signaling engine to cause the signaling engine to transmit at least one signal to create the restoration path.

14. The control module of claim 13, wherein a constrained shortest path first routing protocol is used to determine the restoration path.

15. The control module of claim 13, wherein the signaling engine is configured to use a Generalized Multiprotocol Label Switching (GMPLS) protocol to transmit the at least one signal to create the restoration path.

16. The method of claim 5, wherein the first fault is a loss of frame.

17. The control module of claim 13, wherein the first fault is a loss of frame.

* * * * *